US010157870B1

(12) United States Patent
Wu et al.

(10) Patent No.: US 10,157,870 B1
(45) Date of Patent: Dec. 18, 2018

(54) INTEGRATED FAN-OUT PACKAGE AND METHOD OF FABRICATING THE SAME

(71) Applicant: Taiwan Semiconductor Manufacturing Co., Ltd., Hsinchu (TW)

(72) Inventors: Chih-Wei Wu, Yilan County (TW); Jing-Cheng Lin, Hsinchu (TW); Szu-Wei Lu, Hsinchu (TW); Ying-Ching Shih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/716,494

(22) Filed: Sep. 26, 2017

(51) Int. Cl.

| | |
|---|---|
| ***H01L 23/12*** | (2006.01) |
| ***H01L 23/00*** | (2006.01) |
| ***H01L 21/768*** | (2006.01) |
| ***H01L 23/522*** | (2006.01) |
| ***H01L 23/31*** | (2006.01) |
| ***H01L 21/683*** | (2006.01) |
| ***H01L 23/532*** | (2006.01) |

(52) U.S. Cl.
CPC .......... *H01L 24/11* (2013.01); *H01L 21/6836* (2013.01); *H01L 21/76837* (2013.01); *H01L 21/76885* (2013.01); *H01L 23/3114* (2013.01); *H01L 23/5226* (2013.01); *H01L 23/53238* (2013.01); *H01L 24/14* (2013.01); *H01L 2924/15173* (2013.01)

(58) Field of Classification Search
CPC ................ H01L 23/3114; H01L 24/24; H01L 21/76837; H01L 23/5226; H01L 21/6836; H01L 24/11; H01L 21/76885; H01L 23/53238
USPC .......................................................... 257/700
See application file for complete search history.

(56) References Cited

U.S. PATENT DOCUMENTS 8,980,691 B2 * 3/2015 Lin ........................ H01L 25/50 257/686
9,000,584 B2 4/2015 Lin et al.
9,048,222 B2 6/2015 Hung et al.
9,048,233 B2 6/2015 Wu et al.
9,064,874 B2 6/2015 Edelstein et al.
(Continued)

*Primary Examiner* — Luan C Thai
(74) *Attorney, Agent, or Firm* — JCIPRNET

(57) ABSTRACT

A method of fabricating an integrated fan-out package is described. The method includes the following steps. A carrier is provided. Through insulator vias are formed on the carrier, and at least one semiconductor die is provided on the carrier. The semiconductor die is attached to the carrier through a die attach film. An insulating encapsulant having a first region and a second region is formed on the carrier. The insulating encapsulant in the first region is encapsulating the semiconductor die, and the insulating encapsulant in the second region is encapsulating the plurality of through insulator vias. The carrier is debonded, and a trimming process is performed to remove portions of the insulating encapsulant in the second region, and a trench is formed in the insulating encapsulant in the second region. A plurality of conductive balls is disposed on the insulating encapsulant in the second region. The plurality of conductive balls surround the first region of the insulating encapsulant and the die attach film, and is electrically connected to the plurality of through insulator vias.

19 Claims, 11 Drawing Sheets

(56) References Cited

U.S. PATENT DOCUMENTS

| | | | | |
|---|---|---|---|---|
| 9,064,936 | B2 * | 6/2015 | Lin | H01L 21/6836 |
| 9,111,949 | B2 | 8/2015 | Yu et al. | |
| 9,137,900 | B2 * | 9/2015 | Tanaka | H01L 23/3121 |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2016/0307871 | A1 * | 10/2016 | Tsai | H01L 21/6836 |

* cited by examiner 106
312
103
101
TIV
310
210
220
230
240
250
260
200

INTEGRATED FAN-OUT PACKAGE AND METHOD OF FABRICATING THE SAME

BACKGROUND

In recent years, the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
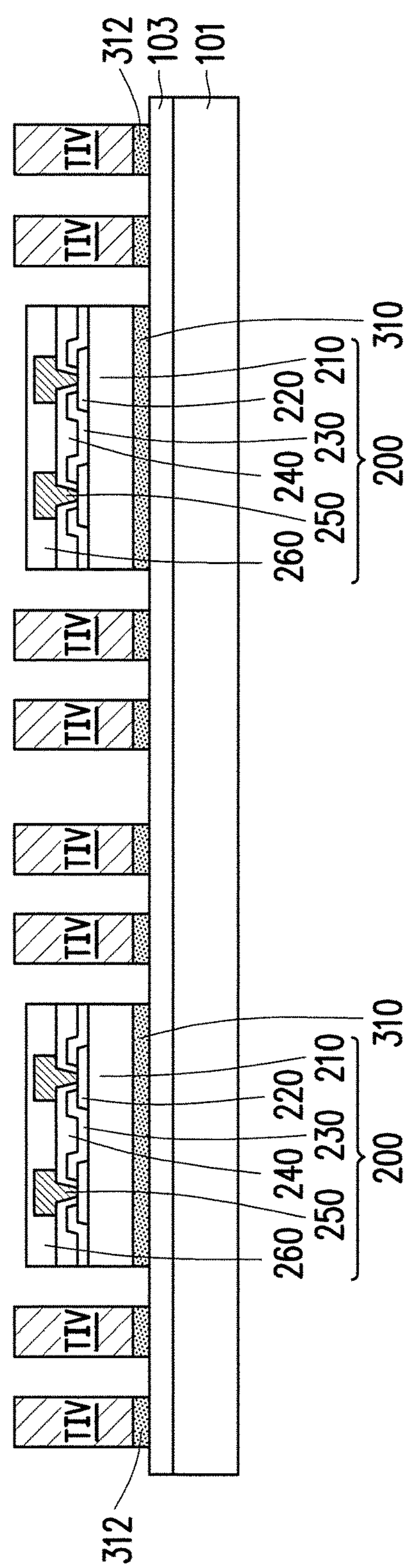
FIG. 1 to FIG. 6B are schematic views of various stages in a method of fabricating a semiconductor package according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 6B are schematic views of various stages in a method of fabricating an integrated fan-out package according to some exemplary embodiments of the present disclosure. Referring to FIG. 1, in some embodiments, a carrier 101 with a buffer layer 103 coated thereon is provided. The carrier 101 may be a glass carrier or any suitable carrier for carrying a semiconductor wafer or a reconstituted wafer used for the method of fabricating the integrated fan-out package. In some embodiments, the buffer layer 103 includes, for example, a light-to-heat conversion (“LTHC”) layer, and such layer enables room temperature debonding from the carrier by applying laser irradiation. Referring to FIG. 1, in certain embodiments, the buffer layer 103 may further include a dielectric material layer made of a dielectric material including benzocyclobutene (“BCB”), polybenzooxazole (“PBO”), or any other suitable polymer-based dielectric material. In some alternative embodiments, the buffer layer 103 may function as the debond layer.

In the exemplary embodiment, as shown in FIG. 1, a plurality of through insulator vias TIV is formed on the buffer layer 103 and over the carrier 101, and a plurality of semiconductor dies 200 is provided on the buffer layer 103. Referring to FIG. 1, in some embodiments, the through insulator vias TIV are through integrated fan-out (“InFO”) vias. In some embodiments, the formation of the through insulator vias TIV includes forming a mask pattern (not shown) with openings, then forming a metallic material (not shown) filling up the openings by electroplating or deposition, and removing the mask pattern to form the through insulator vias TIV on the carrier 101. In certain embodiments, a seed layer 312 may be formed before filling the metallic material and is located between the through insulator vias TIV and the buffer layer 103. The material of the seed layer 312 varies depending on the material of the later-formed through insulator vias TIV. In some embodiments, the material of the through insulator vias TIV may include copper or copper alloys. In certain embodiments, the through insulator vias TIV are copper pillars.

In some embodiments, the semiconductor dies 200 may be picked and placed on the buffer layer 103. In certain embodiments, the semiconductor dies 200 are attached onto the carrier 101 or attached to the buffer layer 103 through a die attach film 310. In the exemplary embodiment, the semiconductor die 200, for example, includes a semiconductor substrate 210, a plurality of conductive pads 220, a passivation layer 230, a post passivation layer 240, a plurality of conductive vias 250, and a protection layer 260. In some embodiments, the passivation layer 230 is formed over the semiconductor substrate 210 and has openings that partially expose the conductive pads 220 on the semiconductor substrate 210. The semiconductor substrate 210 may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 220 may be aluminum pads, copper pads or other suitable metal pads. The passivation layer 230 may be a silicon oxide layer, a silicon nitride layer, a silicon oxy-nitride layer or a dielectric layer formed of any suitable dielectric materials. In the exemplary embodiment, the post-passivation layer 240 is optionally formed over the passivation layer 230. The post-passivation layer 240 covers the passivation layer 230 and has a plurality of contact openings. The conductive pads 220 are partially exposed by the contact openings of the post passivation layer 240. The post-passivation layer 240 may be a benzocyclobutene (BCB) layer, a polyimide layer, a polybenzoxazole (PBO) layer, or a dielectric layer formed by other suitable polymers. In some embodiments, the conductive posts or conductive vias 250 are formed on the conductive pads 220 by plating. In some embodiments, the protection layer 260 is formed on the post passivation layer 240 covering the conductive posts or conductive vias 250 so as to protect the conductive posts or conductive vias 250.

In some embodiments, the semiconductor die 200 placed on the buffer layer 103 may be arranged in an array, and when the semiconductor dies 200 are arranged in an array, the through insulator vias TIV may be classified into groups. The number of the semiconductor die 200 may correspond to the number of the groups of the through insulator vias TIV. In the illustrated embodiment, one or more of the semiconductor die 200 may be picked and placed on the buffer layer 103 after the formation of the through insulator vias TIV. However, the disclosure is not limited thereto. In some alternative embodiments, one or more of the semiconductor die 200 may be picked and placed on the buffer layer 103 before the formation of the through insulator vias TIV.

Figure 2:
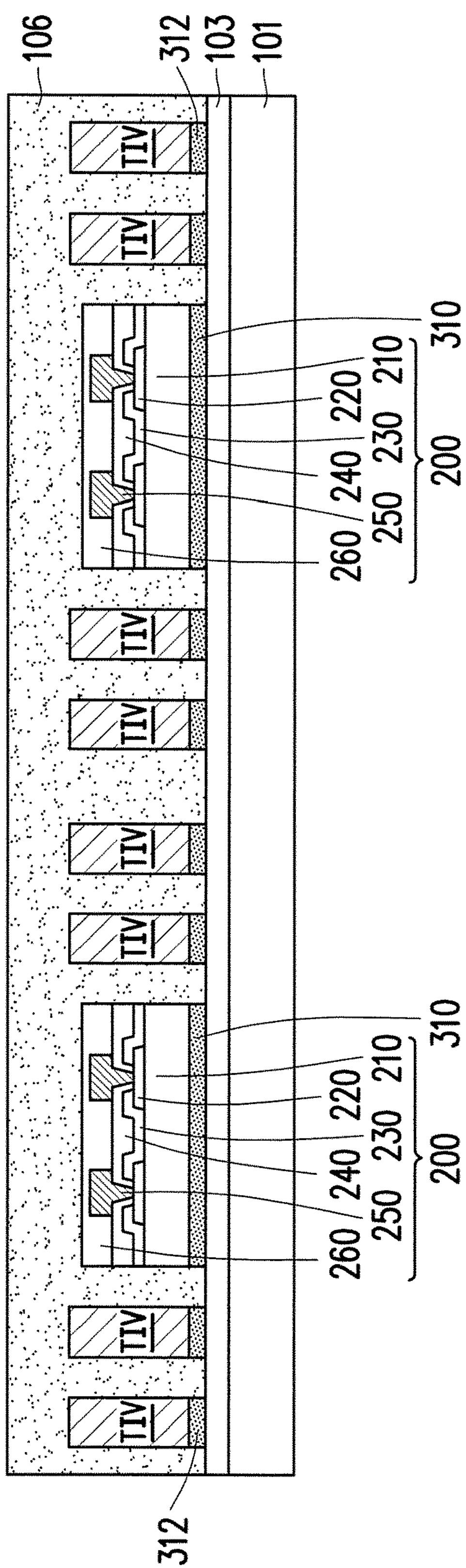

Referring to FIG. 2, an insulating material 106 is formed on the buffer layer 103 and over the semiconductor dies 200. In some embodiments, the insulating material 106 is formed through, for example, a compression molding process, filling up the gaps between the semiconductor dies 200 and encapsulating the semiconductor dies 200. The insulating material 106 also fills up the gaps between adjacent through insulator vias TIV to encapsulate the through insulator vias TIV. The conductive posts or conductive vias 250 and the protection layer 260 of the semiconductor die 200 are encapsulated by and well protected by the insulating material 106. In other words, the conductive posts or conductive vias 250 and the protection layer 260 of the semiconductor die 200 are not revealed and are well protected by the insulating material 106. In some embodiments, the insulating material 106 includes epoxy resins or other suitable resins.

Figure 3:
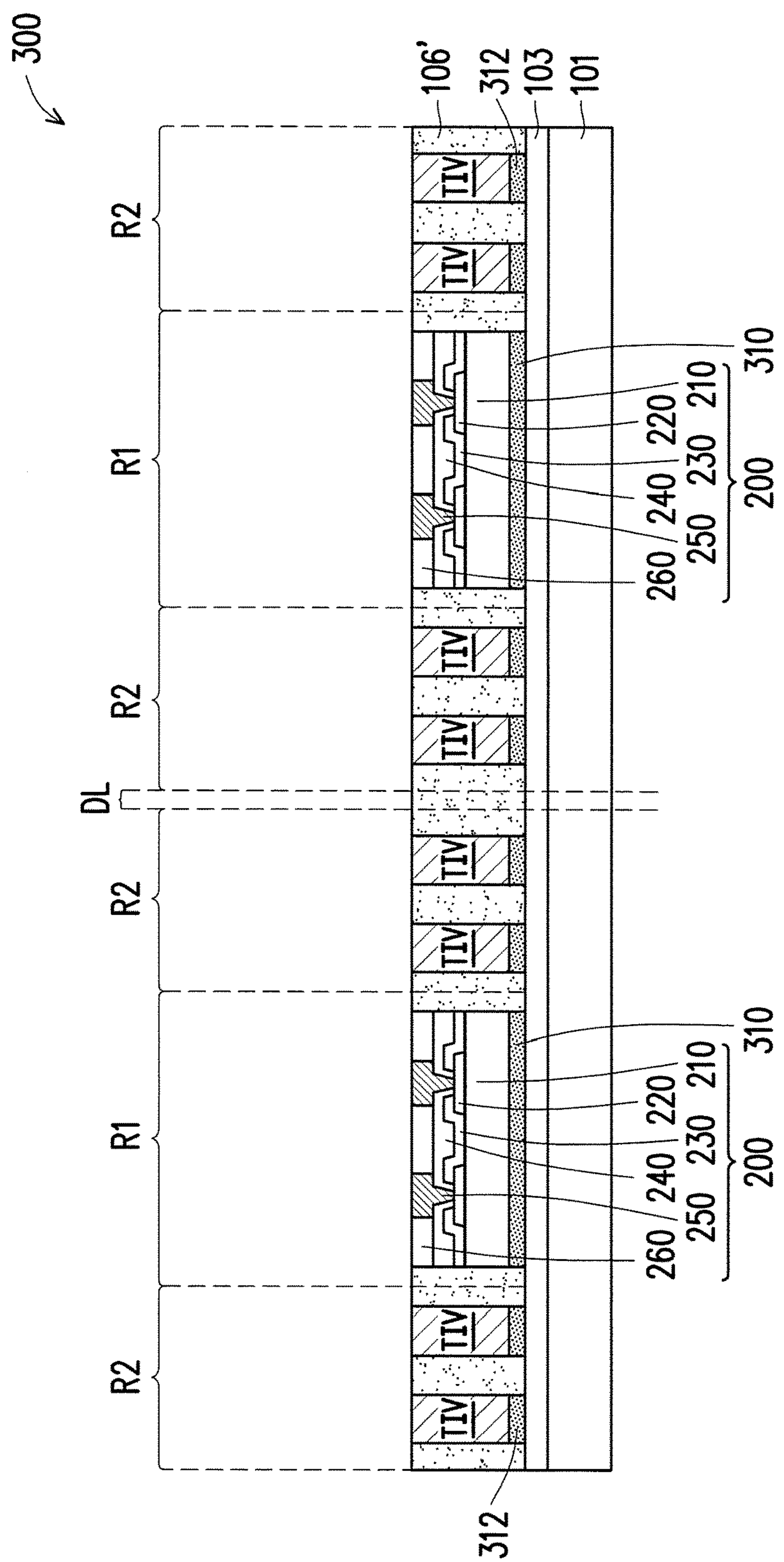

Referring to FIG. 3, the insulating material 106 is partially removed to expose the conductive posts 250 and the through insulator vias TIV. In some embodiments, the insulating material 106 and the protection layer 260 are ground or polished by a mechanical grinding process and/or a chemical mechanical polishing (CMP) process until the top surfaces of the conductive posts 250. In some embodiments, the through insulator vias TIV may be partially polished so that the top surfaces of the through insulator vias TIV are levelled with the top surfaces of the conductive posts 250. The insulating material 106 is polished to form an insulating encapsulant 106'. In some embodiments, the top surfaces of the insulating encapsulant 106', the through insulator vias TIV, the conductive posts 250, and the polished protection layer 260 are coplanar and levelled with one another. In certain embodiments, the whole structure 300 (including the semiconductor dies 200, the through insulator vias TIV and the insulating encapsulant 106') includes a plurality of units (defined by the double dashed lines labelled with DL). In some embodiments, the insulating encapsulant 106' within each unit includes a first region R1 and a second region R2. In certain embodiments, the semiconductor die 200 is encapsulated by the insulating encapsulant 106' located in the first region R1, and the through insulator vias TIV are encapsulated by the insulating encapsulant 106' located in the second region R2. As illustrated in FIG. 3, in some embodiments, the first region R1 of the insulating encapsulant 106' is surrounded by the ring-shaped second region R2 of the insulating encapsulant 106'. That is, in some embodiments, the first region R1 may be isolated by the second region R2.

Figure 4:
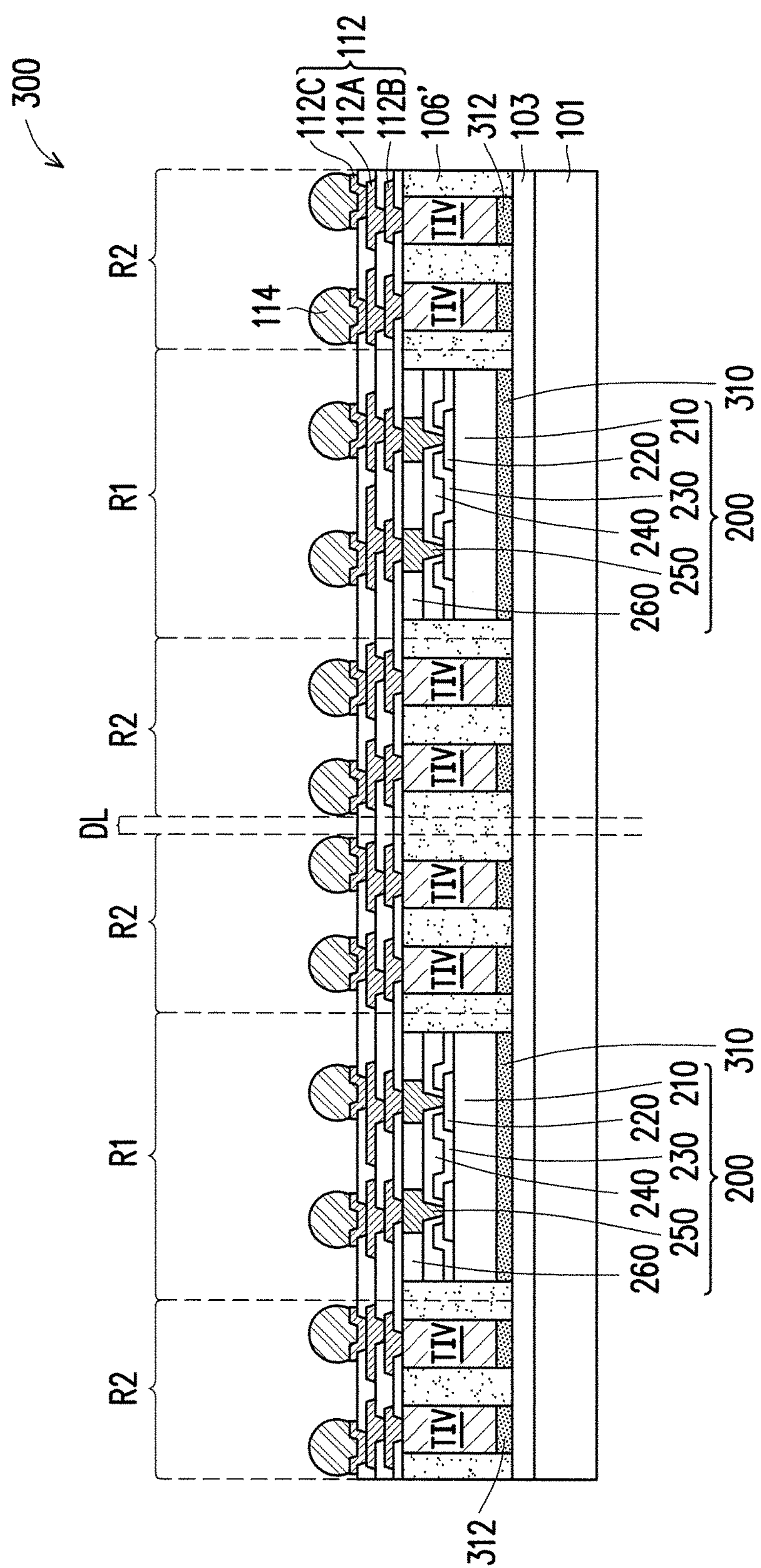

Referring to FIG. 4, after the grinding process, a redistribution layer 112 is formed on the semiconductor die 200, on the through insulator vias TIV, and on the other side of the insulating encapsulation 106' opposite to the side where the carrier 101 is located on. In some embodiments, the redistribution layer 112 includes a plurality of inter-dielectric layers 112B and a plurality of conductive layers 112A stacked alternately. Although only two layers of the conductive layers 112A and three layers of inter-dielectric layers 112B are illustrated herein, however, the scope of the disclose is not limited by the embodiments of the disclosure. In other embodiments, the number of conductive layers 112A and the inter-dielectric layers 112B may be adjusted based on product requirement. In some embodiments, the conductive layers 112A are electrically connected to the conductive posts 250 of the semiconductor die 200 and the through insulator vias TIV embedded in the insulating encapsulation 106'. After forming the redistribution layer 112, a plurality of conductive balls 114 may be placed on the redistribution layer 112. In some embodiments, the topmost inter-dielectric layers 112B of the redistribution layer 112 may include a plurality of conductive pads 112C. The conductive pads 112C are for example, under-ball metallurgy (UBM) patterns used for ball mount. In certain embodiments, the conductive balls 114 are placed on the conductive pads 112C through a ball placement process. In some embodiments, the conductive balls 114 are electrically connected to the semiconductor dies 200 through the conductive pads 112C and the conductive layers 112A of the redistribution layer 112.

Figure 5:
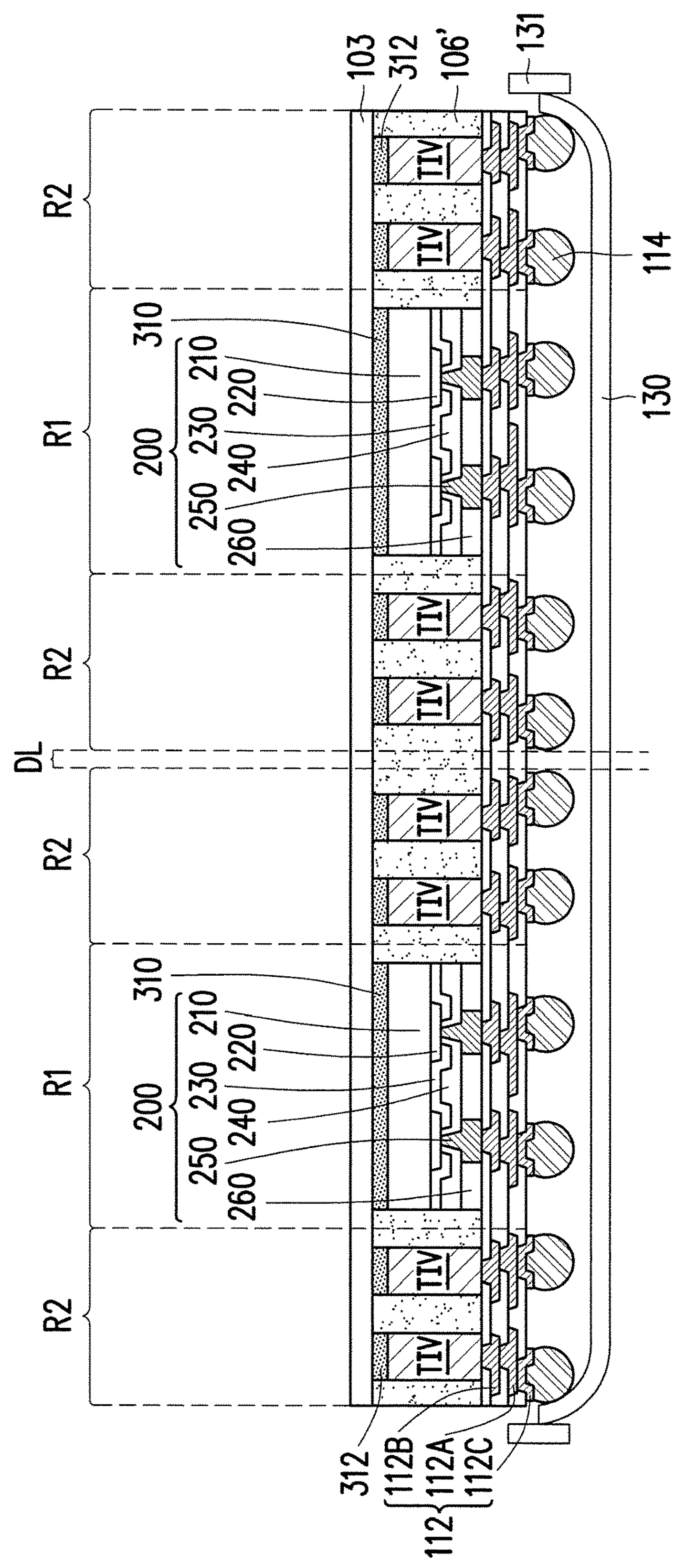

Referring to FIG. 5, after forming the redistribution layer 112 and the conductive balls 114, the structure shown in FIG. 4 is turned upside down and attached to a tape 130 (e.g., a dicing tape 130) supported by a frame 131. In some embodiments, the carrier 101 is debonded so as to separate the semiconductor dies 200 and the buffer layer 103 from the carrier 101. In accordance with some embodiments, the debonding process includes projecting a light such as a laser light or an UV light on the buffer layer 103, and the carrier 101 can be easily removed. In certain embodiments, the buffer layer 103 may be further removed or peeled off. In certain embodiments, the buffer layer 103 including a dielectric material layer may be remained on the insulating encapsulation 106' after debonding the carrier 101.

Figure 6A:
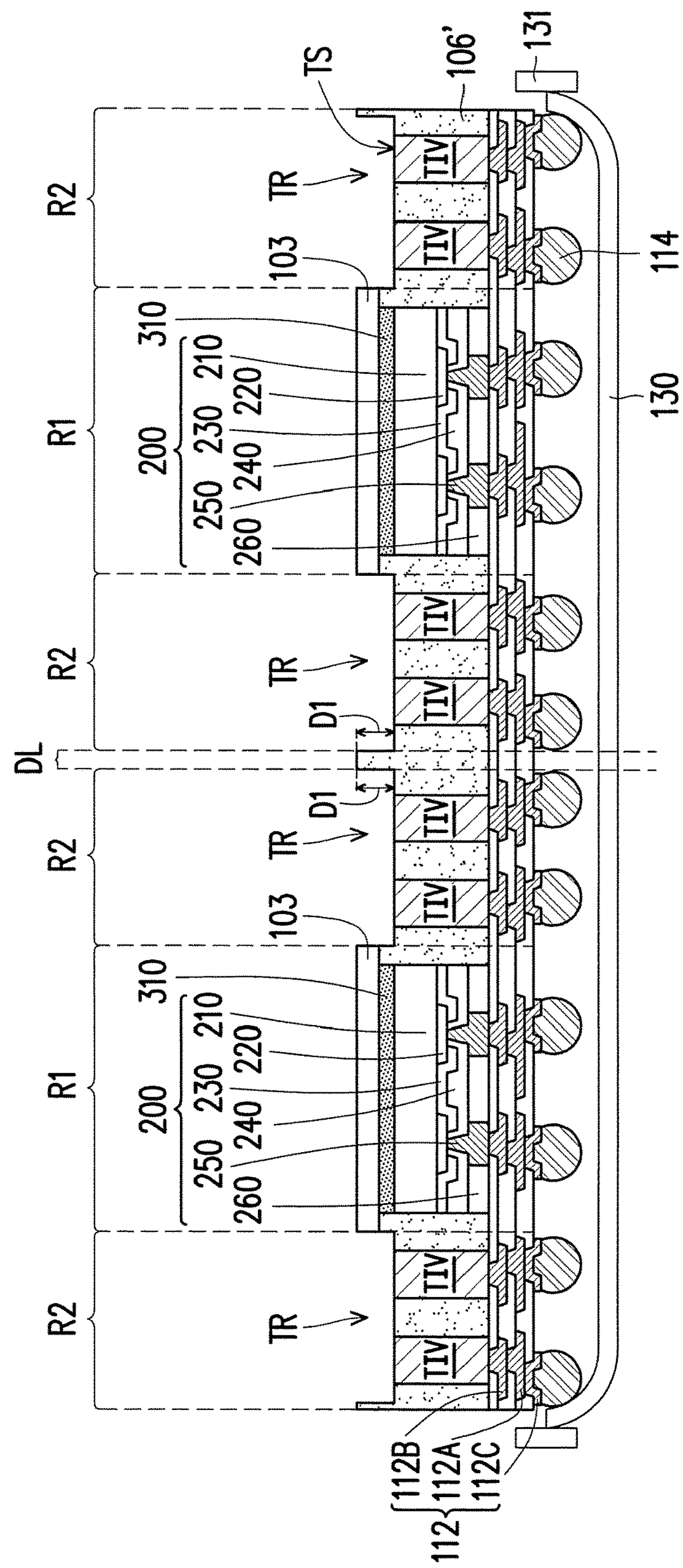

Referring to FIG. 6A, after debonding the carrier 101, a trimming process is performed to simultaneously remove portions of the insulating encapsulant 106' in the second region R2 and portions of the buffer layer 103, so as to form trenches TR that surrounds the first region R1 of the insulating encapsulant 106'. In some embodiments, the trimming process removes portions of the buffer layer 103 and the insulating encapsulant 106' until the through insulator vias TSV are exposed by the trenches TR. In certain embodiments, the trimming process further removes portions of the buffer layer 103 and the seed layer 312 until top surfaces TS of the through insulator vias TSV are exposed by the trenches TR. As illustrated in FIG. 6A, in some embodiments, a depth D1 of the trenches TR corresponds to a sum of a thickness of the buffer layer 103 and the seed layer 312. That is, in certain embodiments, the depth D1 of the trenches TR may be controlled by adjusting the thickness of the buffer layer 103 and the seed layer 312. In some exemplary embodiment, the depth D1 of the trenches TR is in a range of approximately 5 μm to 100 μm. In the illustrated embodiment, a thickness of the die attach film 310 is approximately equal to a thickness of the seed layer 312. However, the embodiments of the disclosure are not limited thereto. In alternative embodiments, a thickness of the seed layer 312 may be greater than or smaller than a thickness of the die attach film 310, and a depth D1 of the trenches TR may vary depending on the design requirements of these layers. In the exemplary embodiment, the insulating encapsulant 106' in the second region R2 and the buffer layer 103 located on the second region R2 are removed by the trimming process to form the trenches TR, whereas the insulating encapsulant 106' in the first region R1 and the buffer layer 103 located on the first region R1 are retained. That is, in some embodiments, the trimming process is not performed to remove the insulating encapsulant 106' in the first region. In certain embodiments, the trimming process is for example, performed by mechanical sawing, however, the embodiment is not limited thereto. In alternative embodiments, the trimming process may be performed by using other processes as long as the trenches TR shown in FIG. 6A can be formed.

Figure 6B:
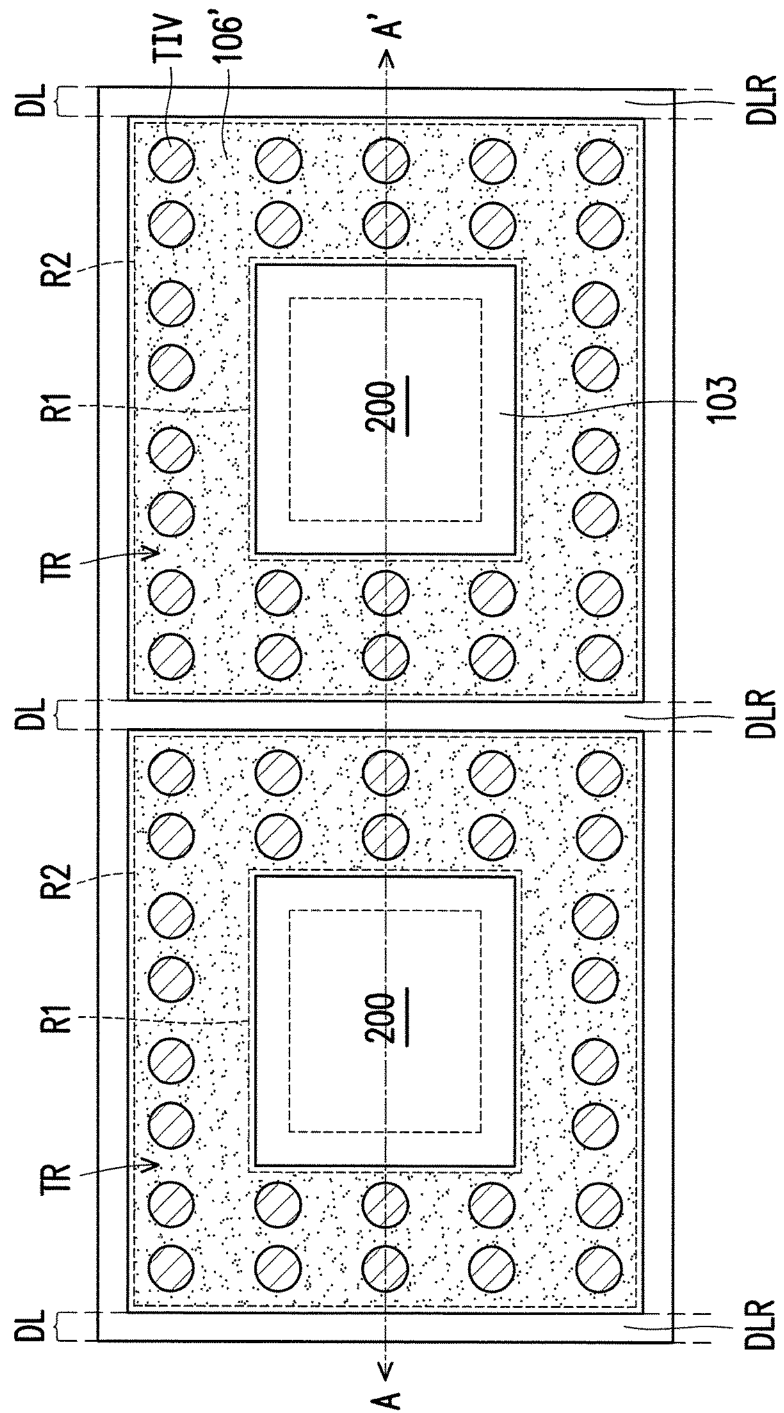

FIG. 6B is a top view of the package structure shown in FIG. 6A. For example, the structure shown in FIG. 6A is the sectional view taken along line A-A' of FIG. 6B. As more clearly represented in FIG. 6B, in some embodiments, the trenches TR are formed in the second region R2 of the insulating encapsulant 106', and the trenches TR surround the first region R1 of the insulating encapsulant 106'. In certain embodiments, the trenches TR surround the buffer layer 103, the insulating encapsulant 106' in the first region R1, the die attach film 310, and the semiconductor dies 200. In some embodiments, in FIG. 6B, certain portions of the insulating encapsulant 106 located in regions DLR of the dicing lanes DL are not trimmed during the trimming process. In the illustrated embodiment, it should be noted that the number of through insulator vias TIV and the number of semiconductor dies 200 are not limited to those shown in FIG. 6B, and these can be adjusted based on product requirements. Similarly, the dimensions of the insulating encapsulant 106' that defines the first region R1 and the second region R2 can be adjusted based on requirement, as long as the first region R1 corresponds to a region where the semiconductor die 200 is located and is encapsulated by the insulating encapsulant 106', and the second region R2 corresponds to a region where the through insulator vias TIV are located and are encapsulated by the insulating encapsulant 106'.

Subsequently, in certain embodiments, a dicing process is performed to cut the whole package structure (at least cutting though the insulating encapsulant 106' and the redistribution layer 112) along the dicing lanes DL into individual and separated semiconductor dies/semiconductor packages 10 shown in FIG. 7A and FIG. 7B. In one embodiment, the dicing process is a wafer dicing process including mechanical blade sawing or laser cutting. In some embodiments, the remained portions of the insulating encapsulant 106 located in regions DLR of the dicing lanes DL are removed or cut off during the dicing process.

Figure 7A:
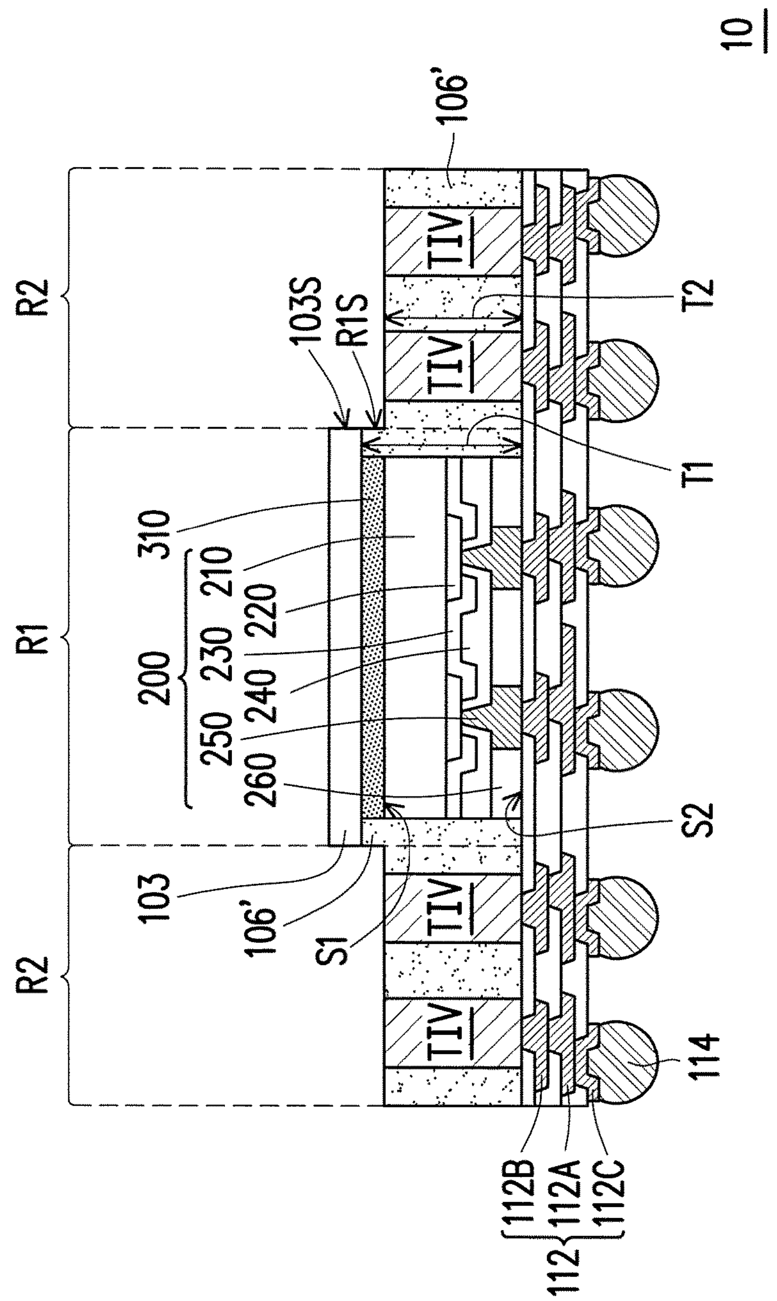
FIG. 7A to FIG. 7B and FIG. 8 are schematic views of a semiconductor package according to some exemplary embodiments of the present disclosure.
Figure 7B:
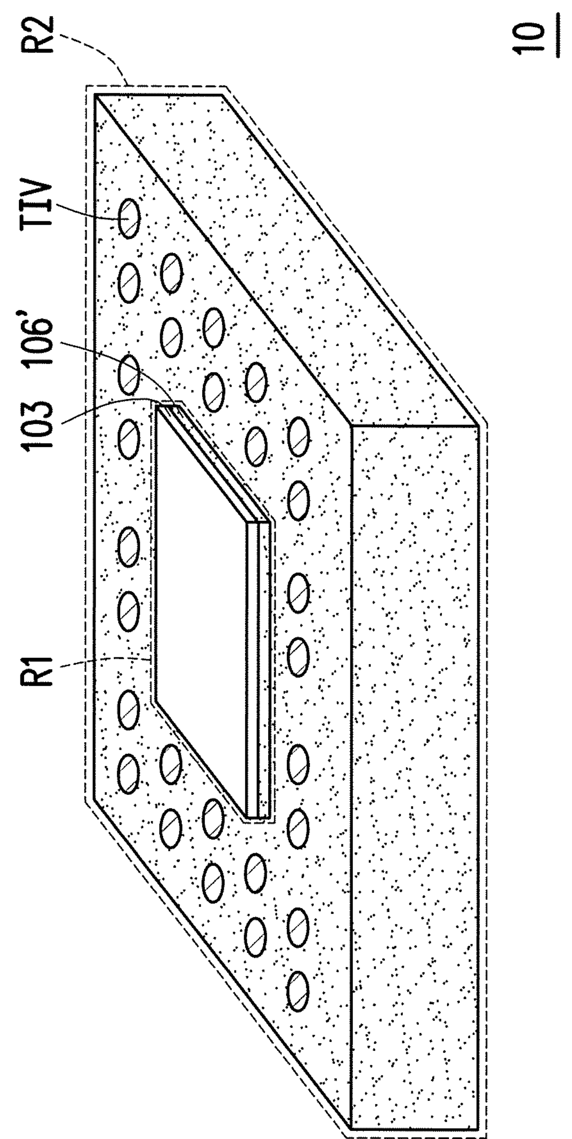

FIG. 7A is a sectional view of the semiconductor package 10, while FIG. 7B is a perspective view of the semiconductor package 10 shown in FIG. 7A. Referring to FIG. 7A and FIG. 7B, after the dicing process, a first semiconductor package 10 is formed. As shown in FIG. 7A and FIG. 7B, the first semiconductor package includes at least one first semiconductor die 200 having a first surface S1 and a second surface S2 opposite to the first surface S1. In some embodiments, the die attach film 310 is attached to the first surface S1 of the first semiconductor die 200. In certain embodiments, the redistribution layer 112 is disposed on the insulating encapsulant 106', and on the second surface S2 of the first semiconductor die 200. In some embodiments, the through insulator vias TIV are surrounding the first semiconductor die 200.

Furthermore, in the illustrated embodiment, the insulating encapsulant 106' has a first region R1 and a second region R2 surrounding the first region R1. In certain embodiments, the insulating encapsulant 106' in the first region R1 is surrounded and isolated by the insulating encapsulant 106' in the second region R2. In certain embodiments, the insulating encapsulant 106' encapsulates the first semiconductor die 200 and the die attach film 310 in the first region R1, and the insulating encapsulant 106' encapsulates the through insulator vias TIV in the second region R2. In some embodiments, a thickness T1 of the insulating encapsulant 106' in the first region R1 is greater than a thickness T2 of the insulating encapsulant 106' in the second region R2. In some embodiments, a ratio of the thickness T1 to the thickness T2 is in a range of approximately 0.05:1 to 1:1. As more clearly shown in FIG. 7B, a level of the insulating encapsulant 106' in the first region R1 is different to a level of the insulating encapsulant 106' in the second region R2. That is, in some embodiments, a level of the insulating encapsulant 106' in the first region R1 is higher than a level of the insulating encapsulant 106' in the second region R2. As shown in FIG. 7A and FIG. 7B, in some embodiments, the buffer layer 103 is disposed on the die attach film 310 and the insulating encapsulant 106' in the first region R1. In certain embodiments, the buffer layer 103 do not come in contact with the insulating encapsulant 106' in the second region R2. In some embodiments, sidewalls 103S of the buffer layer 103 are aligned with sidewalls R1S of the insulating encapsulant 106' in the first region R1. In certain embodiments, the sidewalls 103*s* of the buffer layer 103 are coplanar with the sidewalls R1S of the insulating encapsulant 106' in the first region.

Figure 8:
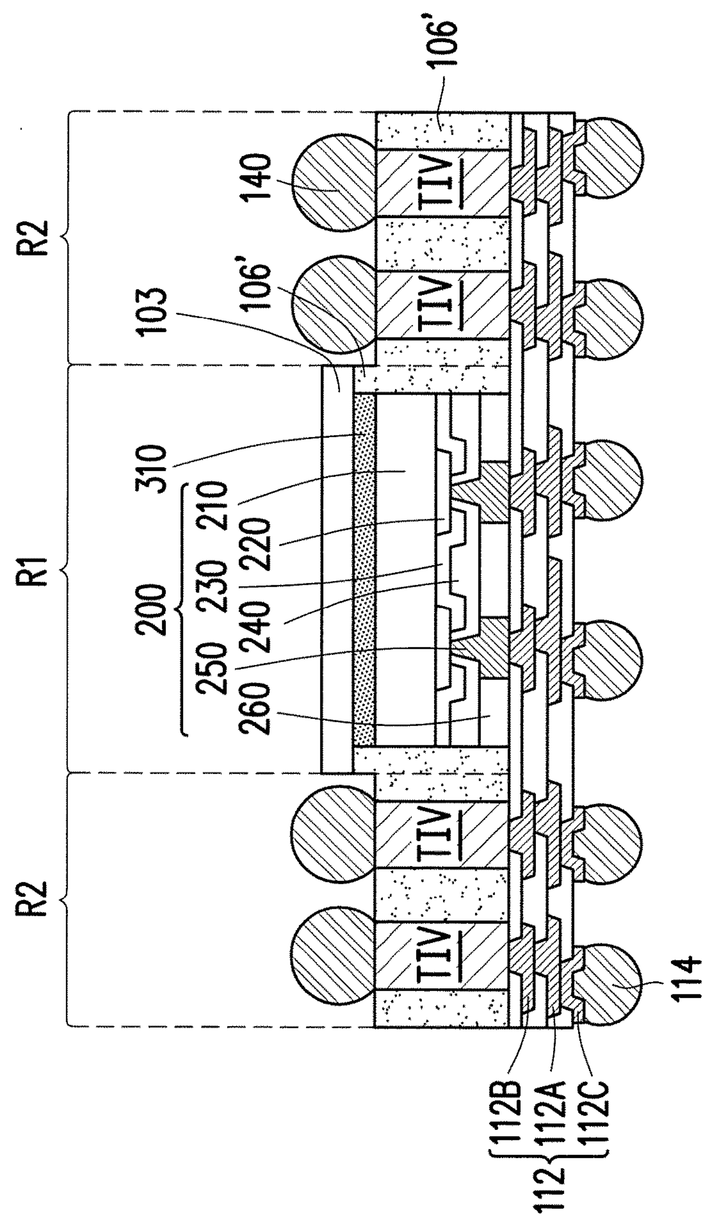

Referring to FIG. 8, after forming the individual semiconductor packages 10, a plurality of conductive balls 140 are disposed on the insulating encapsulant 106' in the second region R2 so as to provide further connection. In some embodiments, the conductive balls 140 are, for example, solder balls or lead free solder balls. In some embodiments, a material of the conductive balls 140 includes, for example, tin, silver, copper, nickel, bismuth, zinc, manganese, antimony, indium, cadmium, gold and/or alloys thereof. In certain embodiments, the conductive balls 140 are located on the second region R2 of the insulating encapsulant 106', and surround the first region R1 of the insulating encapsulant 106' and the die attach film 310. In some embodiments, each of the conductive balls 140 are electrically connected to one of the through insulator vias TIV that is encapsulated by the insulating encapsulant 106' in the second region R2. In some embodiments, the conductive balls 140 are, for example, electrically connected to the redistribution layer 112 of the first semiconductor package 10. The conductive balls 140 are used for providing electrical connection between the first semiconductor package 10 and another package such that a package-on-package (POP) structure is fabricated.

Figure 9:
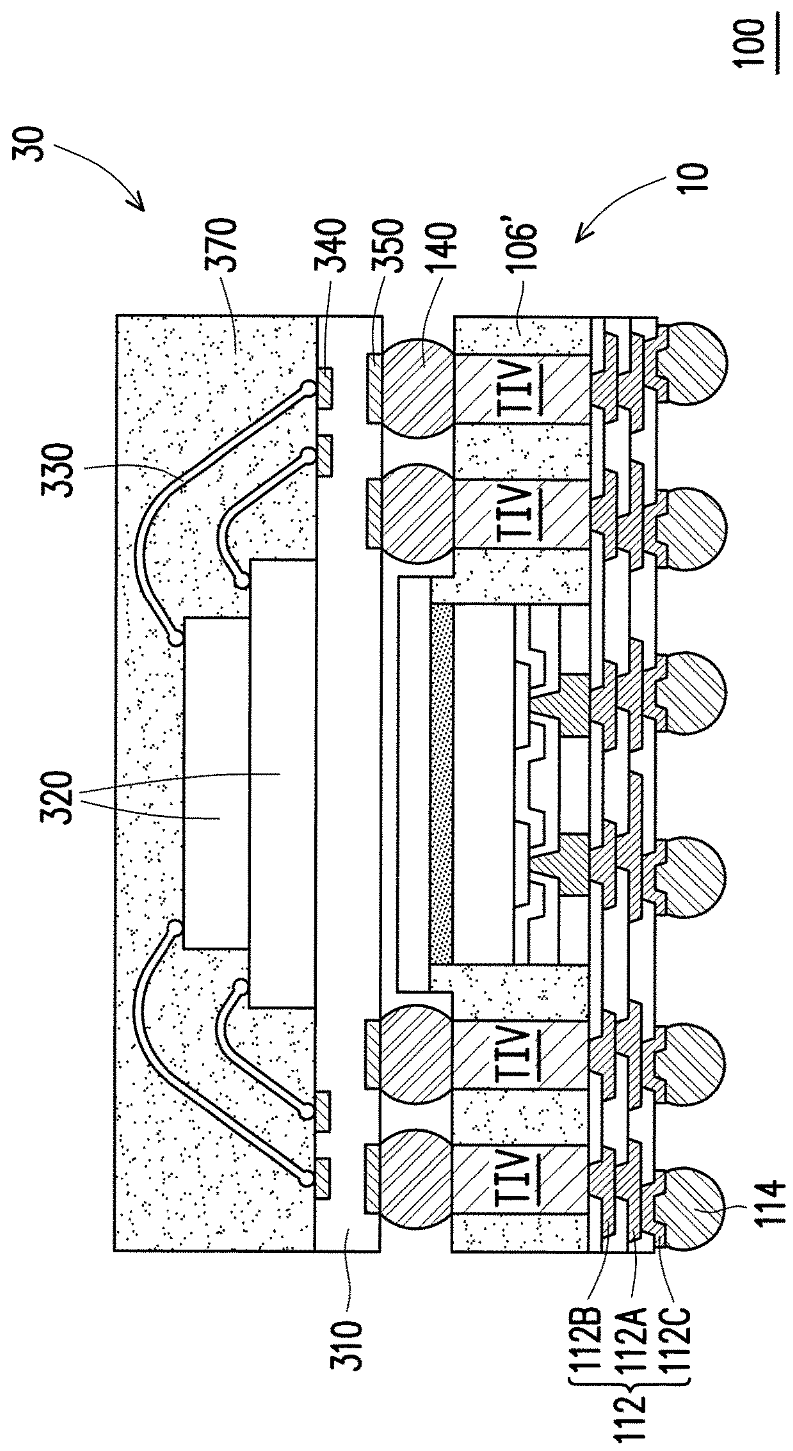
FIG. 9 is a schematic view of an integrated fan-out package according to some exemplary embodiments of the present disclosure.

Referring to FIG. 9, after disposing the conductive balls 140, a second semiconductor package 30 is provided, wherein the second semiconductor package 30 is electrically connected to the first semiconductor package through the plurality of conductive balls 140. In some embodiments, the second semiconductor package 30 is stacked or mounted on the first semiconductor package 10. In the illustrated embodiment, the second semiconductor package 30 has a substrate 310, and a second semiconductor die 320 mounted on one surface (e.g. top surface) of the substrate 310. In some embodiments, bonding wires 330 are used to provide electrical connections between the second semiconductor die 320 and pads 340 (such as bonding pads). In some embodiments, an insulating encapsulant 370 is formed to encapsulate the second semiconductor die 320 and the bonding wires 330 to protect these components. In some embodiments, through insulator vias (not shown) may be used to provide electrical connection between the pads 340 and conductive pads 350 (such as bonding pads) that are located on another surface (e.g. bottom surface) of the substrate 310. In certain embodiments, the conductive pads 350 are electrically connected to the second semiconductor die 320 through these through insulator vias (not shown). In some embodiments, the conductive pads 350 of the second semiconductor package 30 are electrically connected to the through insulator vias TIV of the first semiconductor package 10 through the conductive balls 140 that are sandwiched therebetween. After stacking the second semiconductor package 30 on the first semiconductor package 10, and providing electrical connection between the packages through conductive balls 140, an integrated fan-out package 100 can be fabricated.

In the above embodiments, since a trimming process is performed to remove portions of the buffer layer and the insulating encapsulant located in the second region, a semiconductor die with greater thickness in the first region may be applied during the fabrication process. By providing a semiconductor die with increased thickness for the method of fabricating an integrated fan-out package mentioned above, better heat dissipation can be obtained without changing the total package height.

In some embodiments of the present disclosure, a method of fabricating an integrated fan-out package is described. The method includes the following steps. A carrier is provided. A plurality of through insulator vias is provided on the carrier, and at least one semiconductor die is provided on the carrier. The semiconductor die is attached to the carrier through a die attach film. An insulating encapsulant having a first region and a second region is formed on the carrier. The insulating encapsulant in the first region is encapsulating the semiconductor die and the insulating encapsulant in the second region is encapsulating the plurality of through insulator vias. The carrier is debonded, and a trimming process is performed to remove portions of the insulating encapsulant in the second region and a trench is formed in the insulating encapsulant in the second region. A plurality of conductive balls is disposed on the insulating encapsulant in the second region. The plurality of conductive balls surround the first region of the insulating encapsulant and the die attach film, and is electrically connected to the plurality of through insulator vias.

In some embodiments of the present disclosure, a method of fabricating an integrated fan-out package is described. The method includes forming a first semiconductor package by the following steps. A carrier is provided. A plurality of through insulator vias is formed on the carrier and a plurality of semiconductor dies is provided on the carrier. Each of the semiconductor dies are attached to the carrier through a die attach film. An insulating encapsulant is formed on the carrier, the insulating encapsulant having first regions and second regions surrounding the first regions. The insulating encapsulant in the first regions are encapsulating the plurality of semiconductor dies, and the insulating encapsulant in the second regions are encapsulating the plurality of through insulator vias. A redistribution layer is formed on the insulating encapsulant opposite to a side where the carrier is located. The carrier is debonded, and a trimming process is performed to remove portions of the insulating encapsulant in the second regions, and trenches are formed in the insulating encapsulant in the second region. A dicing process is performed to cut through the insulating encapsulant so as to separate the plurality of semiconductor dies. A plurality of conductive balls is disposed on the insulating encapsulant in the second region. The plurality of conductive balls surround the first regions of the insulating encapsulant and the die attach film, and is electrically connected to the plurality of through insulator vias. A second semiconductor package stacked on the first semiconductor package is then provided. The second semiconductor package is electrically connected to the first semiconductor package through the plurality of conductive balls.

In some embodiments of the present disclosure, an integrated fan-out package including a first semiconductor package, a second semiconductor package and a plurality of conductive balls is provided. The second semiconductor package is stacked on the first semiconductor package. The plurality of conductive balls is electrically connecting the first semiconductor package to the second semiconductor package. The first semiconductor package includes at least one first semiconductor die, a die attach film, a plurality of through insulator vias, an insulating encapsulant and a redistribution layer. The at least one first semiconductor die has a first surface and a second surface. The die attach film is attached to the first surface of the first semiconductor die. The insulating encapsulant has a first region and a second region surrounding the first region. The insulating encapsulant in the first region encapsulates the first semiconductor die and surrounds the die attach film, the insulating encapsulant in the second region encapsulates the through insulator vias. A thickness of the insulating encapsulant in the first region is greater than a thickness of the insulating encapsulant in the second region. The redistribution layer is disposed on the insulating encapsulant and on the second surface of the first semiconductor die. The second semiconductor package includes at least one second semiconductor die and a plurality of conductive pads. The plurality of conductive pads is electrically connected to the second semiconductor die. The plurality of conductive pads is electrically connected to the plurality of through insulator via of the first semiconductor package through the plurality of conductive balls.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated fan-out package, comprising:
providing a carrier;
forming a plurality of through insulator vias on the carrier and providing at least one semiconductor die on the carrier, wherein the semiconductor die is attached to the carrier through a die attach film;
forming an insulating encapsulant having a first region and a second region on the carrier, wherein the insulating encapsulant in the first region is encapsulating the semiconductor die and the insulating encapsulant in the second region is encapsulating the plurality of through insulator vias;
debonding the carrier;
performing a trimming process to remove portions of the insulating encapsulant in the second region and forming a trench in the insulating encapsulant in the second region; and
disposing a plurality of conductive balls on the insulating encapsulant in the second region, wherein the plurality of conductive balls surround the first region of the insulating encapsulant and the die attach film, and is electrically connected to the plurality of through insulator vias.

2. The method according to claim 1, further comprising forming a buffer layer on the carrier before forming a plurality of through insulator vias on the carrier and providing at least one semiconductor die on the carrier.

3. The method according to claim 2, wherein the trimming process further removes portions of the buffer layer until the plurality of through insulator vias is exposed by the trench.

4. The method according to claim 3, wherein the trimming process simultaneously removes portions of the insulating encapsulant in the second region and portions of the buffer layer.

5. The method according to claim 2, further comprising forming a seed layer on the buffer layer before forming a plurality of through insulator vias on the carrier.

6. The method according to claim 5, wherein the trimming process further removes portions of the buffer layer and the seed layer until the plurality of through insulator vias is exposed by the trench.

7. The method according to claim 1, wherein performing a trimming process comprises thinning the insulating encapsulant in the second region so that a thickness of the insulating encapsulant in the first region is greater than a thickness of the insulating encapsulant in the second region.

8. The method according to claim 1, wherein the trimming process is performed by mechanical sawing.

9. A method of fabricating an integrated fan-out package, comprising:
forming a first semiconductor package, which comprises:
providing a carrier;
forming a plurality of through insulator vias on the carrier and providing a plurality of semiconductor dies on the carrier, wherein each of the semiconductor dies are attached to the carrier through a die attach film;
forming an insulating encapsulant on the carrier, the insulating encapsulant having first regions and second regions surrounding the first regions, wherein the insulating encapsulant in the first region are encapsulating the plurality of semiconductor dies, and the insulating encapsulant in the second region are encapsulating the plurality of through insulator vias;
forming a redistribution layer on the insulating encapsulant opposite to a side where the carrier is located;
debonding the carrier;
performing a trimming process to remove portions of the insulating encapsulant in the second regions and forming trenches in the insulating encapsulant in the second region; and
performing a dicing process cutting through the insulating encapsulant so as to separate the plurality of semiconductor dies;
disposing a plurality of conductive balls on the insulating encapsulant in the second region, wherein the plurality of conductive balls surround the first regions of the insulating encapsulant and the die attach film, and is electrically connected to the plurality of through insulator vias;
providing a second semiconductor package stacked on the first semiconductor package, wherein the second semiconductor package is electrically connected to the first semiconductor package through the plurality of conductive balls.

10. The method according to claim 9, further comprising:
forming a buffer layer on the carrier before forming a plurality of through insulator vias on the carrier and providing at least one semiconductor die on the carrier.

11. The method according to claim 10, wherein the trimming process further removes portions of the buffer layer until the plurality of through insulator vias is exposed by the trench.

12. The method according to claim 10, further comprising:
forming a seed layer on the buffer layer before forming a plurality of through insulator vias on the carrier.

13. The method according to claim 12, wherein the trimming process further removes portions of the buffer layer and the seed layer until the plurality of through insulator vias is exposed by the trench.

14. The method according to claim 10, wherein the trimming process simultaneously removes portions of the insulating encapsulant in the second region and portions of the buffer layer.

15. The method according to claim 9, wherein performing a trimming process comprises thinning the insulating encapsulant in the second region so that a thickness of the insulating encapsulant in the first regions is greater than a thickness of the insulating encapsulant in the second regions.

16. The method according to claim 9, wherein the trimming process is performed by mechanical sawing.

17. An integrated fan-out package, comprising:
a first semiconductor package and a second semiconductor package stacked on the first semiconductor package; and
a plurality of conductive balls electrically connecting the first semiconductor package to the second semiconductor package,
wherein the first semiconductor package comprises:
at least one first semiconductor die having a first surface and a second surface;

a die attach film attached to and in contact with the first surface of the first semiconductor die;

a plurality of through insulator vias surrounding the first semiconductor die; and an insulating encapsulant having a first region and a second region surrounding the first region, wherein the insulating encapsulant in the first region encapsulates the first semiconductor die and surrounds the die attach film, the insulating encapsulant in the second region encapsulates the through insulator vias, and a thickness of the insulating encapsulant in the first region is greater than a thickness of the insulating encapsulant in the second region;

a buffer layer disposed above the die attach film and above the insulating encapsulant, wherein the buffer layer has a bottom surface facing the first semiconductor die, and the bottom surface of the buffer layer is in contact with the insulating encapsulant in the first region;

a redistribution layer disposed on the insulating encapsulant and on the second surface of the first semiconductor die, and the second semiconductor package comprises:

at least one second semiconductor die; and a plurality of conductive pads electrically connected to the second semiconductor die, wherein the plurality of conductive pads is electrically connected to the plurality of through insulator via of the first semiconductor package through the plurality of conductive balls.

18. The integrated fan-out package according to claim 17, wherein sidewalls of the buffer layer are aligned with sidewalls of the insulating encapsulant in the first region.

19. The integrated fan-out package according to claim 17, wherein the plurality of conductive balls surrounds the buffer layer and the die attach film.

* * * * *